(12) United States Patent
Tao et al.

(10) Patent No.: US 10,256,091 B2
(45) Date of Patent: Apr. 9, 2019

(54) OXIDE FOR SEMICONDUCTOR LAYER OF THIN-FILM TRANSISTOR, SEMICONDUCTOR LAYER OF THIN-FILM TRANSISTOR HAVING SAID OXIDE, AND THIN-FILM TRANSISTOR

(71) Applicants: Kobe Steel, Ltd., Kobe-shi (JP); Samsung Display Co., Ltd., Yongin (KR)

(72) Inventors: Hiroaki Tao, Kobe (JP); Aya Miki, Kobe (JP); Shinya Morita, Kobe (JP); Satoshi Yasuno, Kobe (JP); Toshihiro Kugimiya, Kobe (JP); Jae Woo Park, Seongnam (KR); Je Hun Lee, Seoul (KR); Byung Du Ahn, Hwaseong (KR); Gun Hee Kim, Hwaseong (KR)

(73) Assignees: Kobe Steel, Ltd., Kobe-shi (JP); Samsung Display Co., Ltd., Yongin (KR)

( * ) Notice: Subject to any disclaimer, the term of this patent is extended or adjusted under 35 U.S.C. 154(b) by 0 days.

(21) Appl. No.: 15/290,715

(22) Filed: Oct. 11, 2016

(65) Prior Publication Data

US 2017/0053800 A1 Feb. 23, 2017

Related U.S. Application Data

(63) Continuation of application No. 14/004,020, filed as application No. PCT/JP2012/055966 on Mar. 8, 2012, now abandoned.

(30) Foreign Application Priority Data

Mar. 9, 2011 (JP) ................................ 2011-052179
Dec. 28, 2011 (JP) ................................ 2011-289740

(51) Int. Cl.
*H01L 21/00* (2006.01)
*H01L 21/02* (2006.01)
(Continued)

(52) U.S. Cl.
CPC .. *H01L 21/02554* (2013.01); *H01L 21/02565* (2013.01); *H01L 21/02587* (2013.01);
(Continued)

(58) Field of Classification Search
CPC .......... H01L 29/7869; H01L 21/02554; H01L 21/02565; H01L 21/02631;
(Continued)

(56) References Cited

U.S. PATENT DOCUMENTS 6,351,068 B2 2/2002 Yamazaki
8,212,248 B2 7/2012 Itagaki et al.
(Continued)

FOREIGN PATENT DOCUMENTS

JP 2008-243928 A 10/2008
JP 2009-164393 A 7/2009
(Continued)

OTHER PUBLICATIONS

International Search Report dated Apr. 3, 2012 in PCT/JP2012/055966.
(Continued)

*Primary Examiner* — Thinh T Nguyen
(74) *Attorney, Agent, or Firm* — Oblon, McClelland, Maier & Neustadt, L.L.P.

(57) ABSTRACT

The oxide of the present invention for thin-film transistors is an In—Zn—Sn-based oxide containing In, Zn, and Sn, wherein when the respective contents (atomic %) of metal elements contained in the In—Zn—Sn-based oxide are expressed by [Zn], [Sn], and [In], the In—Zn—Sn-based oxide fulfills the following expressions (2) and (4) when
(Continued)

$[In]/([In]+[Sn])≤0.5$; or the following expressions (1), (3), and (4) when $[In]/([In]+[Sn])>0.5$.

$$[In]/([In]+[Zn]+[Sn])≤0.3 \quad (1),$$

$$[In]/([In]+[Zn]+[Sn])≤1.4×\{[Zn]/([Zn]+[Sn])\}-0.5 \quad (2),$$

$$[Zn]/([In]+[Zn]+[Sn])≤0.83 \quad (3),$$

and $$0.1≤[In]/([In]+[Zn]+[Sn]) \quad (4).$$

According to the present invention, oxide thin films for thin-film transistors can be obtained, which provide TFTs with excellent switching characteristics, and which have high sputtering rate in the sputtering and properly controlled etching rate in the wet etching.

2 Claims, 6 Drawing Sheets

(51) Int. Cl.
*H01L 29/786* (2006.01)
*H01L 29/12* (2006.01)
*H01L 29/66* (2006.01)
*H01L 21/477* (2006.01)
*G02F 1/1368* (2006.01)

(52) U.S. Cl.
CPC ...... *H01L 21/02631* (2013.01); *H01L 21/477* (2013.01); *H01L 29/12* (2013.01); *H01L 29/66969* (2013.01); *H01L 29/7869* (2013.01); *G02F 1/1368* (2013.01)

(58) Field of Classification Search
CPC ............ H01L 29/66969; H01L 29/12; H01L 21/02587; H01L 21/47; G02F 1/1368
USPC .................. 438/85, 86, 104, 754; 257/43.49
See application file for complete search history.

(56) References Cited

U.S. PATENT DOCUMENTS

| | | | | |
|---|---|---|---|---|
| 8,232,552 B2* | 7/2012 | Yano | ..................... | C23C 14/086 257/347 |
| 8,753,548 B2* | 6/2014 | Yano | ..................... | C04B 35/453 174/126.2 |
| 8,784,700 B2 | 7/2014 | Inoue | | |
| 2001/0019244 A1* | 9/2001 | Yamazaki | .............. | H05B 33/28 313/506 |
| 2008/0237600 A1* | 10/2008 | Miyazaki | ............ | H01L 29/4908 257/66 |
| 2009/0315001 A1 | 12/2009 | Campet | | |
| 2010/0140609 A1* | 6/2010 | Yano | .................... | H01L 29/7869 257/43 |
| 2010/0155717 A1* | 6/2010 | Yano | ..................... | C23C 14/086 257/43 |
| 2010/0276685 A1 | 11/2010 | Itagaki et al. | | |
| 2011/0240988 A1* | 10/2011 | Yano | ................. | H01L 29/78609 257/43 |
| 2011/0260121 A1* | 10/2011 | Yano | ..................... | C04B 35/453 252/519.51 |
| 2013/0112971 A1 | 5/2013 | Yano et al. | | |
| 2013/0181218 A1 | 7/2013 | Maeda et al. | | |

FOREIGN PATENT DOCUMENTS

| | | |
|---|---|---|
| JP | 2009-253204 A | 10/2009 |
| WO | WO 2008/117739 A1 | 10/2008 |
| WO | WO 2010/023889 A1 | 3/2010 |
| WO | WO 2010/067571 A1 | 6/2010 |

OTHER PUBLICATIONS

International Preliminary Report on Patentability and Written Opinion dated Sep. 19, 2013 in PCT/JP2012/055966.
Solid Physics, vol. 44, 2009, pp. 621-633 (with English language equivalent: Kenji Nomura, et al. "Amorphous Oxide Semiconductors for High-Performance Flexible Thin-Film Transistors" Japanese Journal of Applied Physics, vol. 45, No. 5B, 2006, pp. 4303-4308).
Kenji Nomura, et al., "Room-temperature fabrication of transparent flexible thin-film transistors using amorphous oxide semiconductors" Nature, vol. 432, Nov. 25, 2004, pp. 488-492.
Min Ki Ryu, et al., "High performance thin film transistor with cosputtered amorphous Zn—In—Sn—O channel: Combinatorial approach" Applied Physics Letters, vol. 95, No. 072104, 2009, 4 Pages.
Eri Fukumoto, et al., "High Mobility Oxide Semiconductor TFT for Circuit Integration of AM-OLED" The Proceedings of the 17th International Display Workshops (IDW' 10), 2010, pp. 631-634.

* cited by examiner

OXIDE FOR SEMICONDUCTOR LAYER OF THIN-FILM TRANSISTOR, SEMICONDUCTOR LAYER OF THIN-FILM TRANSISTOR HAVING SAID OXIDE, AND THIN-FILM TRANSISTOR

CROSS REFERENCE TO RELATED APPLICATIONS

The present application is a continuation of U.S. patent application Ser. No. 14/004,020, filed on Sep. 9, 2013, the text of which is incorporated herein by reference and which is a 35 U.S.C. § 371 national stage patent application of international patent application PCT/JP12/055966, filed on Mar. 8, 2012, the text of which is incorporated herein by reference and which claims the benefit of the Japanese patent applications JP 2011-289740 and JP 2011-052179, filed Dec. 28, 2011 and Mar. 9, 2011, respectively, the texts of which are also incorporated herein by reference.

TECHNICAL FIELD

The present invention relates to an oxide for a semiconductor layer of a thin-film transistor to be used for display devices such as liquid crystal displays and organic EL displays, and a semiconductor layer; a sputtering target for forming a film of the oxide; and a thin-film transistor having the oxide, and a display device.

BACKGROUND ART

As compared with widely used amorphous silicon (a-Si), an amorphous (noncrystalline) oxide semiconductor has high carrier mobility, a high optical band gap, and film formability at low temperatures, and therefore, has been highly expected to be applied for next generation displays which are required to have a large size, high resolution, and high-speed drive, resin substrates which has low heat resistance, and the like.

In the oxide semiconductors, amorphous oxides containing indium, gallium, zinc, and oxygen (In—Ga—Zn—O, which may hereinafter be referred to as "IGZO"), and amorphous oxides containing indium, zinc, tin, and oxygen (In—Zn—Sn—O, which may hereinafter be referred to as "IZTO"), are preferably used because of their having very high carried mobility. For example, Non-Patent Documents 1 and 2 disclose a thin-film transistor (TFT) including an IGZO semiconductor thin film of In:Ga:Zn=1.1:1.1:0.9 (atomic % ratio) as a semiconductor layer (active layer) of the thin-film transistor (TFT).

As examples of using an IZTO semiconductor, there can be mentioned, for example, Patent Documents 1 and 2, as well as Non-Patent Documents 3 and 4. Patent Document 1 discloses an amorphous oxide (IZTO) containing elements, such as In, Zn, and Sn, and Mo, where Mo has an atomic composition ratio of 0.1 to 5 atomic % with respect to the total number of metal atoms in the amorphous oxide. A TFT including an active layer of IZTO doped with Mo is disclosed in the examples of Patent Document 1.

PRIOR ART DOCUMENTS

Patent Documents

Patent Document 1: JP-A 2009-164393
Patent Document 2: JP-A 2008-243928

Non-Patent Documents

Non-patent Document 1: Solid Physics, Vol. 44, p. 621 (2009)
Non-patent Document 2: Nature, Vol. 432, p. 488 (2004)
Non-Patent Document 3: Applied Physics Letters, Vol. 95, 072104 (2009)
Non-Patent Document 4: The Proceedings of The 17th International Display Workshops (IDW' 10), AMD5/OLED6-2, p. 631 (2010)

SUMMARY OF THE INVENTION

Problems to be Solved by the Invention

In the case where an oxide semiconductor is used as a semiconductor layer for a thin-film transistor, the oxide semiconductor is required not only to have a high electronic carrier concentration but also to be excellent in switching properties (transistor characteristics) of TFT. Specifically, the oxide semiconductor is required to satisfy (1) high ON-current (maximum drain current when positive voltage is applied to a gate electrode and a drain electrode); (2) low OFF-current (drain current when negative voltage is applied to a gate electrode and positive voltage is applied to a drain voltage); (3) low SS value (Subthreshold Swing, gate voltage required to increase drain current by one digit); (4) stability of threshold voltage when load such as voltage or light irradiation is applied for a long time (voltage at which drain current starts flowing when positive voltage is applied to a drain electrode and either positive or negative voltage is applied to a gate voltage, which is also referred to as threshold voltage); (5) high mobility; (6) uniformity of TFT characteristics in the surface of a large-size grass substrate; and the like. The inventors of the present invention have investigated the above properties of IZTO semiconductor containing Mo as described in the previously mentioned Patent Document 1. As a result, they have found that it showed degradation of ON-current and elevation of SS value compared with that of IZTO. In the previously mentioned Non-Patent Document 3, TFT having an oxide layer formed under the oxygen partial pressure (the ratio of oxygen in an atmosphere gas) made constant to about 7% in the sputtering has a high negative value of threshold voltage when the composition thereof has a high In content, thereby making it impossible to obtain satisfactory TFT characteristics.

By the way, when forming a layer of an oxide semiconductor such as IGZO or IZTO, a sputtering method has been widely used for some reasons, for example, that it can easily form thin films having excellent in-plane uniformity of composition and thickness. When an oxide semiconductor layer is formed by a sputtering method, the film-formation rate in the sputtering (the value obtained by dividing the thickness of an oxide formed by the film-formation time, which may hereinafter be referred to as "sputtering rate") may preferably be increased as much as possible to shorten the film-formation time as much as possible. The sputtering rate may vary depending on the film-formation conditions, but in general, the sputtering rate has a tendency to decrease with an increase in the oxygen partial pressure in the sputtering.

Furthermore, in the production process of a TFT substrate, it is desirable that no residue occurs in the patterning. The occurrence of residue causes deterioration of upper layer coverage or failure of inter-element insulation, resulting in decrease of yield.

Therefore, an IZTO-based semiconductor layer is desired to be provided, which fulfils all of the three characteristics required, i.e., (a) excellent TFT switching characteristics (which may hereinafter be abbreviated as TFT characteristics), (b) high sputtering rate in the sputtering, and (c) no occurrence of residue in the wet etching.

The present invention has been made in view of the above situation. It is an object of the present invention to provide an oxide thin film for semiconductor layers of thin-film transistors, which can provide TFTs with excellent switching characteristics (TFT characteristics), and which has high sputtering rate in the sputtering and causes no occurrence of residue in the wet etching, and a semiconductor layer; a thin-film transistor having the oxide thin film, and a display device; and a sputtering target to be used for the formation of the oxide thin film.

Means for Solving the Problems

The oxide for semiconductor layers of thin-film transistors, according to the present invention, which can solve the above problems, is an In—Zn—Sn-based oxide to be used for a semiconductor layer of a thin-film transistor, comprising In, Zn, and Sn, wherein when the respective contents (atomic %) of metal elements contained in the In—Zn—Sn-based oxide are expressed by [Zn], [Sn], and [In], the In—Zn—Sn-based oxide fulfills, the following expressions (2) and (4) when (a) [In]/([In]+[Sn])≤0.5:

$$[In]/([In]+[Zn]+[Sn])≤1.4×\{[Zn]/([Zn]+[Sn])\}-0.5 \quad (2)$$

and $$0.1≤[In]/([In]+[Zn]+[Sn]) \quad (4)$$

or the following expressions (1), (3), and (4) when (b) [In]/([In]+[Sn])>0.5:

$$[In]/([In]+[Zn]+[Sn])≤0.3 \quad (1)$$

$$[Zn]/([In]+[Zn]+[Sn])≤0.83 \quad (3)$$

and $$0.1≤[In]/([In]+[Zn]+[Sn]) \quad (4).$$

In a preferred embodiment of the present invention, the In—Zn—Sn-based oxide described above is an oxide formed by a sputtering method under the control of oxygen partial pressure to 18% or lower.

In a preferred embodiment of the present invention, the In—Zn—Sn-based oxide described above has a thickness of 30 to 200 nm.

The semiconductor layer of thin-film transistors, according to the present invention, which can solve the above problems, is a semiconductor layer of a thin-film transistor having any oxide as set forth above, wherein the semiconductor layer has an electronic carrier concentration in a range of $10^{15}$ to $10^{18}$ cm$^{-3}$.

In a preferred embodiment of the present invention, the semiconductor layer described above is obtained by heating treatment of any In—Zn—Sn-based oxide as set forth above at 250° C. to 350° C. for 15 to 120 minutes.

The present invention further includes a thin-film transistor comprising an In—Zn—Sn-based oxide as set forth above for a semiconductor layer of the thin-film transistor.

The present invention further includes a display device having a thin-film transistor as set forth above.

The In—Zn—Sn-based oxide sputtering target of the present invention, which can solve the above problems, is an In—Zn—Sn-based oxide sputtering target comprising In, Zn, and Sn, wherein when the respective contents (atomic %) of metal elements contained in the In—Zn—Sn-based oxide sputtering target are expressed by [Zn], [Sn], and [In], the In—Zn—Sn-based oxide sputtering target fulfills, the following expressions (2) and (4) when (a) [In]/([In]+[Sn])≤0.5:

$$[In]/([In]+[Zn]+[Sn])≤1.4×\{[Zn]/([Zn]+[Sn])\}-0.5 \quad (2)$$

and $$0.1≤[In]/([In]+[Zn]+[Sn]) \quad (4)$$

or the following expressions (1), (3), and (4) when (b) [In]/([In]+[Sn])>0.5:

$$[In]/([In]+[Zn]+[Sn])≤0.3 \quad (1)$$

$$[Zn]/([In]+[Zn]+[Sn])≤0.83 \quad (3)$$

and $$0.1≤[In]/([In]+[Zn]+[Sn]) \quad (4).$$

Effects of the Invention

The use of the oxide of the present invention makes it possible to provide a thin-film transistor having excellent TFT characteristics, having high sputtering rate in the sputtering, and causing no occurrence of residue in the wet etching, and further provide a display device having the thin-film transistor.

MODE FOR CARRYING OUT THE INVENTION

Figure 1:
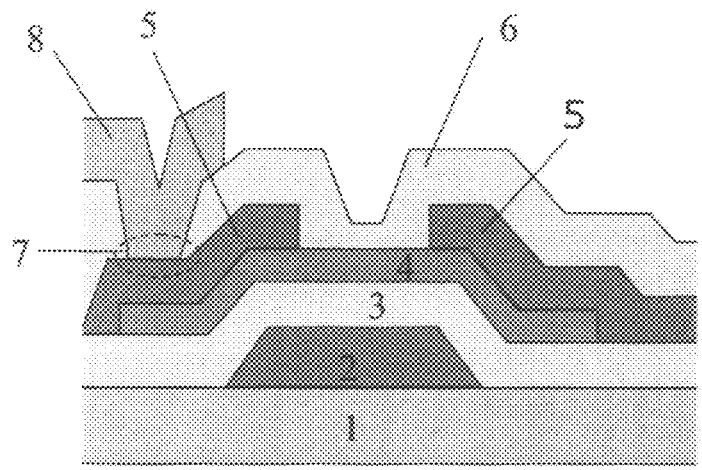
FIG. 1 is a schematic cross-sectional view for describing a thin-film transistor having an oxide semiconductor.

The present inventors have repeated various studies to provide an In—Zn—Sn-based oxide at least containing Zn, Sn, and In (which oxide may hereinafter be represented by "IZTO") that, when used in active layers (or semiconductor layers) of TFTs, (i) can provide the TFTs with high switching characteristics (TFT characteristics), (ii) may have high sputtering rate in the sputtering, and (iii) may cause no occurrence of residue in the wet etching. As a result, the present inventors have found that In—Zn—Sn-based oxides fulfilling the following expressions can achieve the desired object, thereby completing the present invention, i.e., the In—Zn—Sn-based oxides fulfilling, when the respective contents (atomic %) of metal elements contained in each of the In—Zn—Sn-based oxides are expressed by [Zn], [Sn], and [In], the following expressions (2) and (4) when (a) $[In]/([In]+[Sn]) \leq 0.5$:

$$[In]/([In]+[Zn]+[Sn]) \leq 1.4 \times \{[Zn]/([Zn]+[Sn])\} - 0.5 \quad (2)$$

and $$0.1 \leq [In]/([In]+[Zn]+[Sn]) \quad (4)$$

or the following expressions (1), (3), and (4) when (b) $[In]/([In]+[Sn]) > 0.5$:

$$[In]/([In]+[Zn]+[Sn]) \leq 0.3 \quad (1)$$

$$[Zn]/([In]+[Zn]+[Sn]) \leq 0.83 \quad (3)$$

and $$0.1 \leq [In]/([In]+[Zn]+[Sn]) \quad (4).$$

In the present specification, $[In]/([In]+[Zn]+[Sn])$ as the left parts of (1) and (2) above and as the right part of (4) above may be referred to as the "In ratio in all metal elements" for convenience of description.

In contrast to this, the In ratio expressed by $[In]/([In]+[Sn])$ as the left parts of (a) and (b) above may be referred to simply as the "In ratio" for distinction from the above.

Similarly, in the present specification, $[Zn]/([In]+[Zn]+[Sn])$ as the left part of (3) above may be referred to as the "Zn ratio in all metal elements" for convenience of description.

In contrast to this, the Zn ratio expressed by $[Zn]/([Zn]+[Sn])$, which is described in the right part of (2) above, may be referred to simply as the "Zn ratio" for distinction from the above.

Figure 2:
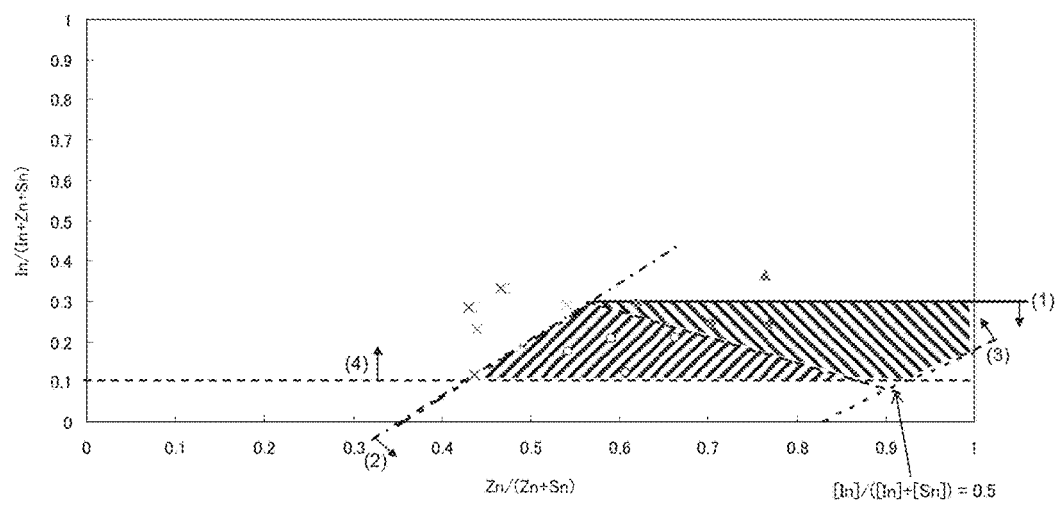
FIG. 2 is a graph showing the regions fulfilling the ranges of the expressions defined in the present invention. The region marked with rising diagonal lines from bottom left to top right (the left lower region in FIG. 2) indicates the range of the present invention when the In ratio is not higher than 0.5 [the range of fulfilling the expressions (2) and (4)]. The region marked with falling diagonal lines from top left to bottom right (the right upper region in FIG. 2) indicates the range of the present invention when the In ratio is higher than 0.5 [the range of fulfilling the expressions (1), (3), and (4)].

FIG. 2 shows the regions fulfilling the above expressions (1), (2), (3), and (4). The portions marked with diagonal lines in FIG. 2 are the regions fulfilling all the requirements defined in the present invention. More specifically, the type of diagonal lines is changed above and below the boundary line corresponding to the In ratio of 0.5 (see FIG. 2). The region marked with diagonal lines on or below the boundary line is the region fulfilling the requirements of the present invention in the case (a) above [i.e., the region fulfilling the expressions (2) and (4)]. The region marked with diagonal lines above the boundary line is the region fulfilling the requirements of the present invention in the case (b) above [i.e., the region fulfilling the expressions (1), (3), and (4)]. In FIG. 2, open circles are plots of the results of Examples fulfilling the requirements of the present invention in the case (a) above among the Examples described below, and cross marks are plots of the results of Comparative Examples not fulfilling the requirements of the present invention in the case (a) above. In FIG. 2, filled circles are plots of the results of Examples fulfilling the requirements of the present invention in the case (b) above among the Examples described below, and filled triangles are plots of the results of Comparative Examples not fulfilling the requirements of the present invention in the case (b) above. It is understood that all the Examples fulfilling the requirements of the present invention are included in the ranges of the above portions marked with diagonal lines.

The expression (3) is an expression relating to the prevention of residue occurrence in the wet etching, and the expressions (1) and (2) are expressions relating to the compatibility between high sputtering rate and satisfactory TFT characteristics (switching characteristics). Regarding the latter characteristics (compatibility between high sputtering rate and satisfactory TFT characteristics), the present invention adopts, depending on the In ratio represented by $[In]/([In]+[Sn])$, the expression (2) as an index when the In ratio is not higher than 0.5 as in the case (a) above, or the expression (1) as an index when the In ratio is higher than 0.5 as in the case (b) above. These expressions (1) and (2) have been derived as the result of arrangement based on many basic experiments made by present inventors. The above expression (4) defines the lower limit of the In ratio in all metal elements ($[In]/([In]+[Zn]+[Sn])$), and its lower limit was determined as 0.1 or higher, in both cases (a) and (b) above, for ensuring high mobility.

In the present invention, the expression (3) is not defined in the case (a) where the In ratio is not higher than 0.5. This is because even if the expression (3) is not defined, the region fulfilling the expressions (2) and (4) includes the region of the expression (3) (see FIG. 2). Therefore, the region fulfilling the expressions (2) and (4) not only can achieve the compatibility between high sputtering rate and satisfactory TFT characteristics but also is also the region exhibiting the effect of preventing residue occurrence in the wet etching [the region fulfilling the expression (3)].

The technical meanings of the expressions (1) and (2) can easily be understood by reference to FIG. 2. In the case (a) where the In ratio is not higher than 0.5, it is found from FIG. 2 that Examples obtaining the above characteristics desired (open circles) and Comparative Examples not obtaining the above characteristics (cross marks) can successfully be sorted with the expression (2) taken as the boundary. In contrast to this, filled triangles in FIG. 2 (plots of No. 13A in a table described below where the In ratio is 0.709) indicates Comparative Examples not obtaining the desired characteristics, although fulfilling the relationship of the expression (2). In other words, with an increase in the In ratio, the relationship with the above characteristics cannot successfully be sorted with the definition of the expression (2), and therefore, it is found that there becomes a need to introduce a new relational expression different form the expression (2). The expression (1) was defined from such a viewpoint, and in the case (b) where the In ratio is higher than 0.5, it is found that Examples obtaining the above characteristics (filled circles) and Comparative Examples not obtaining the above characteristics (filled triangles) can successfully be sorted with the expression (1) taken as the boundary.

The following will describe the background to have reached these expressions. In the film formation of IZTO, there arises the problem that TFTs becomes conductive (becomes not switching) with an increase in the In ratio. Thus, the achievement of TFT switching inevitably requires an increase in oxygen partial pressure; however, there arises the problem that the sputtering rate decreases with an increase in oxygen partial pressure. For achieving TFT switching and increase in sputtering rate (decrease in oxygen partial pressure), taking these problems into consideration, it has been found that there is a need to properly control the In ratio in all metal elements (more specifically, $[In]/([In]+[Zn]+[Sn])$).

On the other hand, in view of switching characteristics as the conditions precedent when used as TFTs, IZTO easily becomes conductive (does not switching) due to carrier increase in the high In- or Sn-content region, and it was found that In has strong action in the high In-content region. Therefore, it was found that for making IZTO have both high sputtering rate and satisfactory TFT characteristics, it is effective to properly control the In ratio in all metal elements depending on the In ratio represented by $[In]/([In]+[Sn])$.

The expressions (1) and (2) described above have been derived as a result of comprehensive consideration of these facts, and for making IZTO have both high sputtering rate and satisfactory TFT characteristics, the following requirements have been established, i.e., the In ratio represented by $[In]/([In]+[Sn])$ of 0.5 is taken as the boundary, and when the In ratio is not higher than 0.5, the In ration in all metal elements is determined to fulfill the following expression (2):

$$[In]/([In]+[Zn]+[Sn]) \leq 1.4 \times \{([Zn]/([Zn]+[Sn]))\} - 0.5 \quad (2)$$

and when the In ratio is higher than 0.5, the In ratio in all metal elements is determined to fulfill the following expression (1):

$$[In]/([In]+[Zn]+[Sn]) \leq 0.3 \quad (1).$$

In this connection, the wording "have high sputtering rate" means the case where the sputtering rate ratio (SR) represented by SR1/SR2 is 1.0 or higher. The term "SR1" (In—Zn—Sn) indicates the sputtering rate (nm/min) when an In—Zn—Sn-based oxide film is formed at an oxygen partial pressure of 4% in the sputtering using an In—Zn—Sn-based sputtering target. The term "SR2" (In—Ga—Zn) indicates the sputtering rate (nm/min) when an In—Ga—Zn-based oxide film (the atomic ratio of In, Ga, and Zn is 1:1:1) is formed, for comparison, with the same sputtering apparatus as used in the calculation of the SR1 (In—Zn—Sn) at the same oxygen partial pressure of 4% in the sputtering using an In—Ga—Zn oxide sputtering target (the atomic ratio of In, Ga, and Zn is 1:1:1).

The wording "satisfactory TFT characteristics" means that TFTs having Vth (absolute value) of 17.5 V or lower were evaluated as having excellent TFT characteristics when the voltage at a drain current of around 1 nA between On-current and Off-current is defined as threshold voltage and each TFT is measured for threshold voltage.

The above expression (3) is an expression relating to the prevention of residue occurrence in the wet etching. As described above, no occurrence of residue is desired in the wet etching. The occurrence of residue mainly involves Zn, and an increase of Zn content in an oxide film causes the occurrence of residue in the wet etching. For example, it is known that when an IZTO film is etched using oxalic acid that has widely been used as a wet etchant, the occurrence of residue is caused by deposition of poorly-soluble zinc oxalate crystals. Thus, the present inventors have made various studies on the requirements for preventing the occurrence of residue in the wet etching. As a result, the present inventors have established the above expression (3) in a relationship with the Zn ratio. In Examples described below, IZTO having no occurrence of residue by observation after etching was evaluated as having excellent wet etching properties. For ensuring satisfactory wet etching properties, the Zn ratio in all metal elements (more specifically, $[Zn]/([In]+[Zn]+[Sn])$) is better when it is as small as possible, and for example, it may preferably be 0.8 or lower, more preferably 0.7 or lower. The lower limit of the Zn ratio in all metal elements is not particularly limited form the viewpoint of wet etching properties, but in view of the fact that low etching rates need more time for patterning, the Zn ratio in all metal elements may preferably be 0.40 or higher, more preferably 0.45 or higher.

The foregoing description was made on the expressions (1), (2), (3), and (4) characterizing the oxide of the present invention.

The above oxide is formed into a film by a sputtering method using a sputtering target (which may hereinafter be referred to as a "target"). The oxide can also be formed by a chemical film formation method such as a coating method, but the use of a sputtering method makes it easy to form a thin film excellent in film in-plane uniformity of components and film thickness.

As a target to be used in the sputtering method, there may preferably be used a target containing the elements described above and having the same composition as that of a desired oxide, thereby making it possible to form a thin film having a desired component composition without a possibility of a composition gap. More specifically, when the respective contents (atomic %) of metal elements contained in the sputtering target, which are expressed by [Zn], [Sn] and [In], the sputtering target fulfills, the following expressions (2) and (4) when (a) $[In]/([In]+[Sn]) \leq 0.5$:

$$[In]/([In]+[Zn]+[Sn]) \leq 1.4 \times \{([Zn]/([Zn]+[Sn]))\} - 0.5 \quad (2)$$

and $$0.1 \leq [In]/([In]+[Zn]+[Sn]) \quad (4)$$

or the following expressions (1), (3), and (4) when (b) $[In]/([In]+[Sn]) > 0.5$:

$$[In]/([In]+[Zn]+[Sn]) \leq 0.3 \quad (1)$$

$$[Zn]/([In]+[Zn]+[Sn]) \leq 0.83 \quad (3)$$

and $$0.1 \leq [In]/([In]+[Zn]+[Sn]) \quad (4).$$

Alternatively, film formation may be carried out by a co-sputtering method for simultaneously discharging two targets with different compositions and consequently, a film with a desired composition can be obtained by co-sputtering targets such as $In_2O_3$, $ZnO$, and $SnO_2$, or a target of their mixture.

The above targets can be produced by, for example, a powder sintering process method.

When sputtering is carried out using the above target, it is preferable that the amount of added oxygen to the total atmospheric gas (oxygen partial pressure) is properly controlled in the sputtering. The substrate temperature may be room temperature in the sputtering, or the substrate may be in a heated state in the sputtering. As described above, when an IZTO film is formed by a sputtering method, threshold voltage shows a positive shift in the high oxygen partial pressure region, but contrarily, sputtering rate becomes decreased. Therefore, it is necessary to make a sputtering target have a composition that can provide satisfactory TFT characteristics, even in the low oxygen partial pressure region capable of ensuring high sputtering rate and satisfactory etching characteristics, and from such a viewpoint, the above requirements were established in the present invention.

The oxygen partial pressure in the sputtering may properly be controlled, more specifically, depending on the sputtering apparatus constitution, target composition, or other factors, but may preferably be controlled approximately to 18% or lower, more preferably 15% to lower. The atmospheric gas in the sputtering may include, in addition to oxygen, inert gases such as Ar, Kr, and Xe. The oxygen partial pressure in the present invention means the ratio of oxygen to these total gases.

The film thickness of the oxide formed into a film as described above is in a range from 30 nm to 200 nm. In an oxide semiconductor layer having an oxide film thickness beyond the above upper limit, it was found that a desired electronic carrier concentration cannot be obtained to ensure satisfactory TFT characteristics (see Examples described below). On the other hand, when the oxide film thickness is below the above lower limit, the control of film thickness in the film formation becomes difficult. The above film thickness may preferably be in a range from 35 nm to 80 nm.

The present invention further includes semiconductor layers of TFTs having the above oxide, and TFTs having these semiconductor layers. TFTs each may at least have a gate electrode, a gate insulator layer, a semiconductor layer of the above oxide, a source electrode, and a drain electrode on a substrate, and their constitution is not particularly limited as long as it is ordinarily used.

In the thin-film transistor of the present invention, the semiconductor layer has an electronic carrier concentration of $10^{15}$ to $10^{18}$ cm$^{-3}$. The electronic carrier concentration of the semiconductor layer is one of the factors determining the TFT switching characteristics. In general, when semiconductor layers have too high electronic carrier concentrations, TFTs having such semiconductor layers become conductive and therefore become not switching. On the other hand, when semiconductor layers have too low electronic carrier concentrations, TFTs having such semiconductor layers have increased insulation properties and therefore have increased resistance. Even if TFTs make switching, TFTs having highly-resistant films cause a problem of On-current increase. Thus, TFT characteristics may greatly vary with electronic carrier concentrations. In the present invention, it was confirmed that electronic carrier concentrations are controlled in a proper range of $10^{15}$ to $10^{18}$ cm$^{-3}$ and therefore TFTs have satisfactory TFT characteristics (in Examples described below, threshold voltage Vth was evaluated).

The semiconductor layer of the present invention, which has an electronic carrier concentration as described above, can be obtained by heating treatment of an oxide as described above at 250° C. to 350° C. for 15 to 120 minutes (the details will be described below).

Referring to FIG. 1, the following will describe embodiments of a production process of TFTs as described above. FIG. 1 and the following production process show one example of preferred embodiments of the present invention, and it is not intended that the present invention be limited thereto. For example, FIG. 1 shows a TFT with a structure of the bottom gate type structure; however, TFTs are not limited thereto, and TFTs may be those of the top gate type, each having a gate insulator layer and a gate electrode successively on an oxide semiconductor layer.

As shown in FIG. 1, a gate electrode 2 and a gate insulator layer 3 are formed on a substrate 1, and an oxide semiconductor layer 4 is formed further thereon. A source-drain electrode 5 is formed on the oxide semiconductor layer 4, and a passivation layer (insulator layer) 6 is formed further thereon, and a transparent conductive film 8 is electrically connected to the drain electrode 5 through a contact hole 7.

A method for forming the gate electrode 2 and the gate insulator layer 3 on the substrate 1 is not particularly limited, and usually used methods can be adopted. The kinds of the gate electrode 2 and the gate insulator layer 3 are also not particularly limited, and widely used ones can be used. For example, metals such as Al and Cu with low electric resistance and their alloys can preferably be used for the gate electrode. Typical examples of the gate insulator layer may include silicon oxide films, silicon nitride films, and silicon oxynitride films. In addition, metal oxides such as $TiO_2$, $Al_2O_3$ and $Y_2O_3$ and those formed by layering them can also be used.

Then, the oxide semiconductor layer 4 is formed. The oxide semiconductor layer 4 may preferably be formed into a film by, as described above, a DC sputtering method or an RF sputtering method using a sputtering target with the same composition as that of the thin film. Alternatively, the film formation may be carried out by a co-sputtering method.

The oxide semiconductor layer 4 is subjected to wet etching and then patterning. In the present invention, just after the patterning, heat treatment (pre-annealing) for improving the film quality of the oxide semiconductor layer 4 is carried out, for example, at a temperature of about 250° C. to 350° C. for a time of about 15 to 120 minutes. This results in an increase of On-current and electric field effect mobility as the transistor characteristics, and an improvement of transistor performance. As shown in Examples described below, if this heat treatment is not carried out, desired electronic carrier concentrations cannot be obtained and satisfactory TFT characteristics cannot be ensured. Preferred pre-annealing conditions are a temperature in a range from about 300° C. to 350° C. and a time in a range from about 60 to 120 minutes.

After the pre-annealing, the source-drain electrode 5 is formed. The kind of the source-drain electrode 5 is not particularly limited, and widely used ones can be used. For example, similarly to the gate electrode, metals such as Al and Cu or their alloys may be used, or pure Ti may be used as in Examples described below. Furthermore, laminated structures of metals, or the like, can also be used.

A method for forming the source-drain electrode 5 may be carried out by, for example, forming a metal thin film by a magnetron sputtering method and forming the metal thin film into the source-drain electrode 5 by a lift-off method. Alternatively, there is a method for forming the source-drain electrode 5 by previously forming a prescribed metal thin film by a sputtering method and thereafter forming the electrode by patterning, not forming the electrode by the lift-off method as described above; however, this method deteriorates the transistor characteristics since the oxide semiconductor layer is damaged at the time of etching of the electrode. Therefore, in order to avoid such problems, a method including previously forming a passivation layer on the oxide semiconductor layer, and subsequently forming the electrode by patterning, is adopted, and this method is used in Examples described below.

Then, the passivation layer (insulator layer) 6 is formed on the oxide semiconductor layer 4 by a CVD (Chemical Vapor Deposition) method. The surface of the oxide semiconductor layer is converted easily to be conductive by plasma-induced damage due to CVD (it is supposedly attributed to that oxygen deficiency formed on the surface of the oxide semiconductor becomes an electron donor), and in order to avoid the problems, $N_2O$ plasma irradiation is carried out before film formation of the passivation layer in Examples described below. The condition described in the following document is adopted as the $N_2O$ plasma irradiation condition.

J. Park, et. al, Appl. Phys. Lett., 1993, 053505 (2008).

Then, the transparent conductive film 8 is electrically connected to the drain electrode 5 through the contact hole 7. The kinds of the transparent conductive film and drain electrode are not particularly limited, and usually used ones can be used. As the drain electrode, materials exemplified for the above source-drain electrodes can be used.

The present application claims the benefit of priority based on the Japanese Patent Application No. 2011-052179, which was filed on Mar. 9, 2011, and the Japanese Patent Application No. 2011-289740, which was filed on Dec. 28, 2011. The whole contents of the specifications of the Japanese Patent Application No. 2011-052179, which was filed on Mar. 9, 2011, and the Japanese Patent Application No. 2011-289740, which was filed on Dec. 28, 2011, are incorporated herein by reference.

EXAMPLES

The following will describe the present invention more specifically by way of Examples, but the present invention is not limited to the Examples described below. The present invention can be put into practice after appropriate modifications or variations within a range capable of meeting the gist described above and below, all of which are included in the technical scope of the present invention.

Example 1

Based on a method as described above, thin-film transistors (TFTs) with a structure as shown in FIG. 1 were produced and then evaluated for various characteristics.

First, a Mo thin film of 100 nm in thickness was formed as a gate electrode on a glass substrate (EAGLE 2000 available from Corning Incorporated, having a size of 100 mm in diameter and 0.7 mm in thickness), followed by photolithography and wet etching for patterning, on which a gate insulator layer $SiO_2$ (250 nm) was formed. The gate electrode was formed by using a pure Mo sputtering target by a DC sputtering method under the following conditions: film formation temperature, room temperature; film formation power, 300 W; carrier gas, Ar, and gas pressure, 2 mTorr. The gate insulator layer was formed by a plasma CVD method under the following conditions: carrier gas, mixed gas of $SiH_4$ and $N_2$; film formation power, 100 W; and film formation temperature, 300° C.

Then, IZTO thin films having various compositions as shown in Tables 1 and 2 (the same Nos. shown in Tables 1 and 2 are corresponding to each other, and have the same composition as each other) were formed by a sputtering method, using IZTO sputtering targets, which have compositions corresponding to those shown in the tables above, and varying the oxygen partial pressure as shown in Table 2. In these tables, Nos. with the letter "A", "B", or "C" close behind indicate the cases where the composition of IZTO is substantially the same but the oxygen particle pressure in the thin film formation is different. The letter "A" means film formation at an oxygen partial pressure of 4%, the letter "B" means film formation at an oxygen partial pressure of 10%, and the letter "C" means film formation at an oxygen partial pressure of 50%. For example, Nos. 5A and 5B have the same [In] and substantially the same [Zn] and [Sn], but film formation was carried out at an oxygen partial pressure of 4% in No. 5A or at an oxygen partial pressure of 10% in No. 5B. Therefore, the IZTO thin films obtained, even if they have the same composition, are different in characteristics such as sputtering rate ratio and Vth.

In this Example, an apparatus used for the sputtering was "CS-200" available from ULVAC, Inc., and the sputtering conditions were as follows:

Substrate Temperature, Room Temperature
Gas pressure, 1 mTorr
Film thickness, 40 nm
Size of target used, ϕ4 inch×5 mm.
(Sputtering Rate Ratio: Calculation of SR)

The sputtering rate (nm/min) of each of various IZTO thin films shown in Table 2 was calculated by dividing the film thickness by the film formation time when film formation was carried out under the following sputtering conditions. This sputtering rate was designated by SR1 (In—Zn—Sn).

Substrate Temperature: Room Temperature
Gas pressure: 1 mTorr
Film formation time: 1200 seconds
Sputtering power: DC 200 W
Size of target used: ϕ4 inch×5 mm For comparison, the sputtering rate (nm/min) of an IGZO thin film was calculated. More specifically, the IGZO thin film was formed under the same sputtering conditions as in the above IZTO thin films, except using an In—Ga—Zn sputtering target, which comprises In, Ga, and Zn [where the contents (atomic %) of In, Ga, and Zn in the sputtering target fulfill the relationship of 1:1:1], and except setting the oxygen partial pressure to 4% (constant). The thickness of the IGZO thin film thus obtained was divided by the film formation time to calculate the sputtering rate. The contents (atomic %) of In, Ga, and Zn in the IGZO thin film obtained in such a manner also fulfill the relationship of 1:1:1. This sputtering rate was designated by SR2 (In—Ga—Zn).

The ratio (sputtering rate ratio) of SR1 (In—Zn—Sn) to SR2 (In—Ga—Zn), both of which were obtained as described above, was calculated, and the values of this ratio were shown as SR in Nos. 1 to 13C of Table 2. The results are shown in Table 2.

The respective contents of metal elements were analyzed by XPS (X-ray Photoelectron Spectroscopy) method.

(Evaluation for Presence of Residue in Wet Etching)

After the formation of various IZTO thin films as described above, patterning was carried out by photolithography and wet etching. As an etchant, "ITO-07N" available from KANTO CHEMICAL CO., INC. (a mixed solution of oxalic acid and water) was used, and solution temperature was set to 40° C. After the wet etching, the presence of reside occurrence was confirmed by visual observation and optical microscopic observation (50-times magnification power). The results are shown in Table 2.

Then, after the patterning of the IZTO thin films as described above, pre-annealing treatment was carried out in air at 350° C. for 1 hour under steam atmosphere for improvement of film quality.

Then, a source-drain electrode was formed by a lift-off method using pure Mo. More specifically, after patterning was carried out using a photoresist, a Mo thin film was formed by a DC sputtering method (the film thickness was 100 nm). A method for forming the Mo thin film for a source-drain electrode is the same as that in the case of the gate electrode described above. Then, an unnecessary photoresist was removed by dipping in acetone with an ultrasonic washing apparatus to provide TFTs with a channel length of 10 μm and a channel width of 200 μm.

After the source-drain electrode was formed as described, a passivation layer was formed to protect each oxide semiconductor layer. As the passivation layer, a layered film (364 nm in total film thickness) of $SiO_2$ (114 nm in film thickness) and SiN (250 nm in film thickness) was used. The above $SiO_2$ and SiN were formed by a plasma CVD method using "PD-220NL" available from SAMCO Inc. In this Example, after plasma treatment was carried out by $N_2O$ gas, the $SiO_2$ film and the SiN film were successively formed. A mixed gas of $N_2O$ and $SiH_4$ was used for the formation of the $SiO_2$ film, and a mixed gas of $SiH_4$, $N_2$, and $NH_3$ was used for the formation of the SiN film. In both cases, the film formation power was set to 100 W and the film formation temperature was set to 150° C.

Then, a contact hole for probing for evaluation of transistor characteristics was formed in the passivation layer by photolithography and dry etching. Then, an ITO film (80 nm in film thickness) was formed using a DC sputtering method under the following conditions: carrier gas, a mixed gas of argon and oxygen gas; film formation power, 200 W; and gas pressure, 5 mTorr, to produce TFTs with a structure as shown in FIG. 1.

The TFTs thus obtained were each evaluated for the following characteristics.

(1) Measurement of Transistor Characteristics

The transistor characteristics (drain current-gate voltage characteristics, Id-Vg characteristics) were measured using a semiconductor parameter analyzer ("4156C" available from Agilent Technologies). The detailed measurement conditions were as follows:

Source voltage, 0V
Drain voltage, 10V
Gate voltage, −30 to 30V (measurement interval: 0.25V).

(2) Threshold Voltage (Vth)

The threshold voltage is roughly a value of gate voltage at the time when a transistor is shifted from OFF state (i.e., state where drain current is low) to ON state (i.e., state where drain current is high). In this Example, the voltage in the case where the drain current is around 1 nA between ON-current and OFF-current is defined as the threshold voltage, and the threshold voltage of each TFT was measured. In this Example, TFTs having a Vth (absolute value) of 17.5 V or lower were evaluated as passing. The results are shown in Table 2. The symbol "−" in Table 2 means TFTs that did not switching (became conductive) in the range of voltage for evaluation (from −30 V to 30V).

Figure 4A:
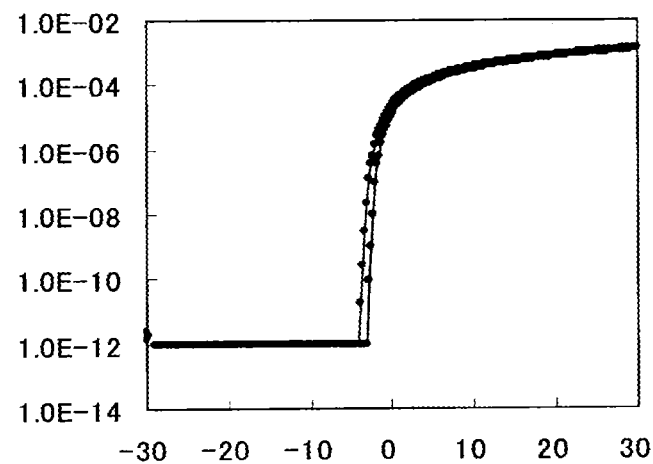
FIG. 4A is a view showing the results of TFT characteristics for No. 2 in Example 1.
Figure 4B:
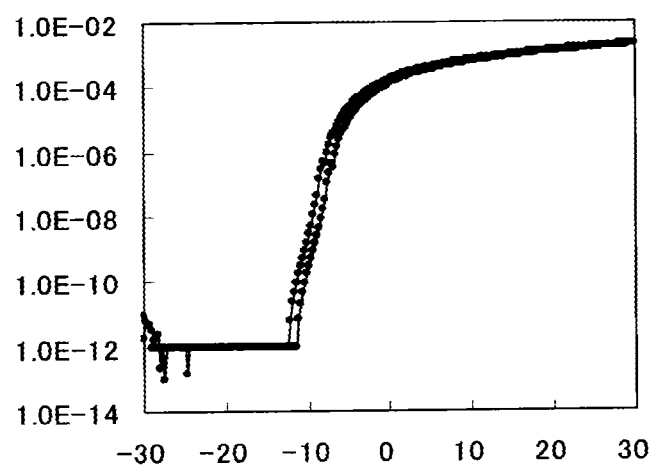
FIG. 4B is a view showing the results of TFT characteristics for No. 7 in Example 1.
Figure 4C:
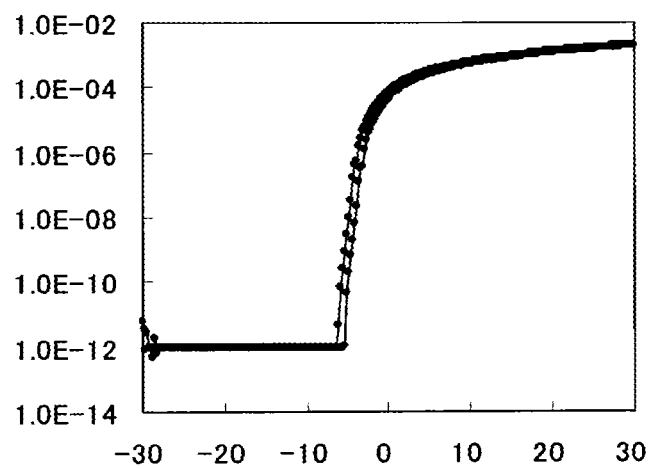
FIG. 4C is a view showing the results of TFT characteristics for No. 10 in Example 1.
Figure 4D:
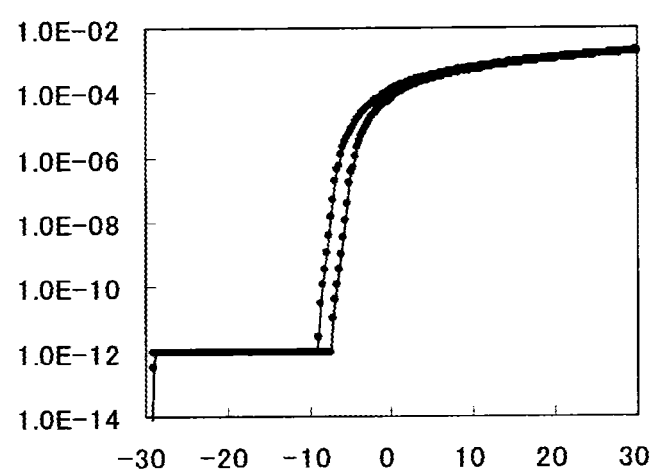
FIG. 4D is a view showing the results of TFT characteristics for No. 5B in Example 1.
Figure 5A:
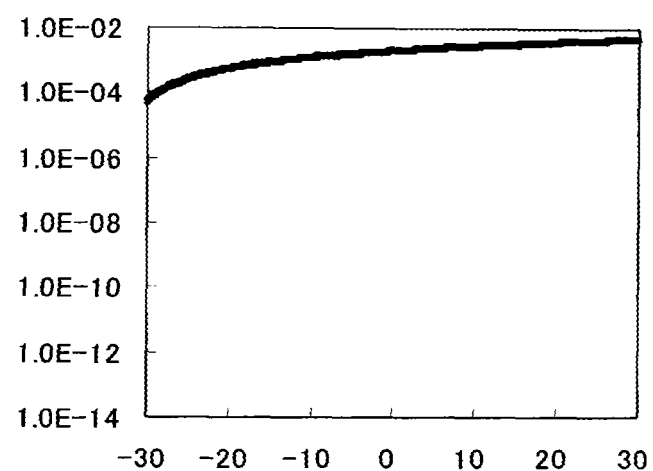
FIG. 5A is a view showing the results of TFT characteristics for No. 13A in Example 1.

The results of drain current vs. gate voltage characteristics (Id-Vg characteristics) for some examples of the present invention are shown in FIGS. 4A (No. 2), 4B (No. 7), 4C (No. 10), and 4D (No. 5B). The results of drain current vs. gate voltage characteristics (Id-Vg characteristics) for Nos. 13A to 13 C in Table 2 failing to fulfill the requirements of the present invention are shown in FIGS. 5A (No. 13A), 5B (No. 13B), and 5C (No. 13C). In these figures, Id (A) and Vg (V) were plotted along the longitude axis and the abscissa axis, respectively. The measurement was carried out two times, both of which results are therefore shown in these figures.

Figure 5B:
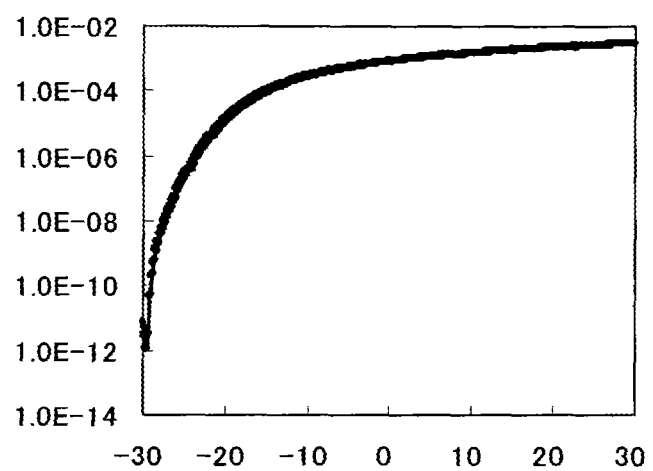
FIG. 5B is a view showing the results of TFT characteristics for No. 13B in Example 1.
Figure 5C:
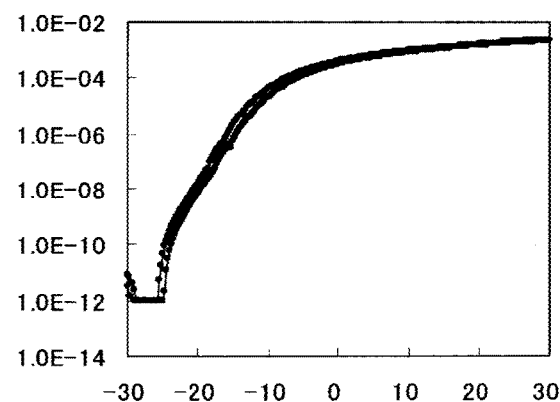
FIG. 5C is a view showing the results of TFT characteristics for No. 13C in Example 1.

In these figures, TFTs fulfilling the requirements of the present invention exhibited an increase in gate voltage Vg by about 8 digits with a variation of gate voltage Vg from −30 V to 30V before the formation of the passivation layer, and therefore, these TFTs obtained satisfactory switching characteristics as shown in FIGS. 4A to 4D. In contrast to this, TFTs failing to fulfill the requirements of the present invention did not obtained satisfactory switching characteristics as shown in FIGS. 5A to 5C. More specifically, there could be seen a tendency that the TFTs did not switching at the oxygen partial pressure of 4% (FIG. 5A) and Vth decreases with an increase of oxygen partial pressure, e.g., Vth=−28.5 V at the oxygen partial pressure of 10% (FIG. 5B) and Vth=−23 V at the oxygen partial pressure of 50% (FIG. 5C); however, the desired level (the absolute value of Vth≤17.5 V) was not still obtained.

(3) Carrier Mobility (Electron Field-effect Mobility)

For reference, the carrier mobility (electron field-effect mobility) was calculated in a saturation region according to the following expression.

$$I_d = \frac{1}{2}\mu_{FE}C_{OX}\frac{W}{L}(V_{gs} - V_{th})^2 \quad \text{[Math 1]}$$

$C_{ox}$: insulator layer capacitance
W: channel width
L: channel length
$V_{th}$: threshold voltage
The results are shown together in Table 2.

TABLE 1

| No. | Remarks | [In] | [Zn] | [Sn] | [In]/([In] + [Sn]) | Left-hand value of expressions (1) and (2) [In]/([In] + [Zn] + [Sn]) | Value of [Zn]/([Zn] + [Sn]) on right-hand side of expression (2) | Left-hand value of expression (3) [Zn]/([In] + [Zn] + [Sn]) |
|---|---|---|---|---|---|---|---|---|
| 1 | (a) | 0.117 | 0.386 | 0.497 | 0.191 | 0.117 | 0.437 | 0.386 |
| 2 | (a) | 0.123 | 0.532 | 0.345 | 0.263 | 0.123 | 0.607 | 0.532 |
| 3 | (a) | 0.176 | 0.447 | 0.377 | 0.318 | 0.176 | 0.542 | 0.447 |
| 4 | (a) | 0.231 | 0.338 | 0.431 | 0.349 | 0.231 | 0.440 | 0.338 |
| 5A | (a) | 0.209 | 0.468 | 0.323 | 0.393 | 0.209 | 0.592 | 0.468 |
| 5B | (a) | 0.209 | 0.467 | 0.324 | 0.392 | 0.209 | 0.590 | 0.467 |
| 6A | (a) | 0.286 | 0.310 | 0.404 | 0.414 | 0.286 | 0.434 | 0.310 |
| 6B | (a) | 0.286 | 0.307 | 0.407 | 0.413 | 0.286 | 0.430 | 0.307 |
| 7 | (a) | 0.211 | 0.523 | 0.266 | 0.442 | 0.211 | 0.663 | 0.523 |

TABLE 1-continued

| No. | Remarks | [In] | [Zn] | [Sn] | [In]/([In] + [Sn]) | Left-hand value of expressions (1) and (2) [In]/([In] + [Zn] + [Sn]) | Value of [Zn]/([Zn] + [Sn]) on right-hand side of expression (2) | Left-hand value of expression (3) [Zn]/([In] + [Zn] + [Sn]) |
|---|---|---|---|---|---|---|---|---|
| 8A | (a) | 0.290 | 0.384 | 0.326 | 0.471 | 0.290 | 0.540 | 0.384 |
| 8B | (a) | 0.290 | 0.384 | 0.326 | 0.471 | 0.290 | 0.541 | 0.384 |
| 9A | (a) | 0.331 | 0.314 | 0.355 | 0.483 | 0.331 | 0.470 | 0.314 |
| 9B | (a) | 0.331 | 0.312 | 0.357 | 0.481 | 0.331 | 0.466 | 0.312 |
| 10 | (b) | 0.242 | 0.534 | 0.224 | 0.519 | 0.242 | 0.704 | 0.534 |
| 11 | (b) | 0.293 | 0.438 | 0.269 | 0.521 | 0.293 | 0.620 | 0.438 |
| 12 | (b) | 0.240 | 0.584 | 0.176 | 0.577 | 0.240 | 0.768 | 0.584 |
| 13A | (b) | 0.365 | 0.485 | 0.150 | 0.709 | 0.365 | 0.764 | 0.485 |
| 13B | (b) | 0.365 | 0.485 | 0.150 | 0.709 | 0.365 | 0.764 | 0.485 |
| 13C | (b) | 0.365 | 0.485 | 0.150 | 0.709 | 0.365 | 0.764 | 0.485 |

TABLE 2

| No. | Remarks | Left-hand value of expressions (1) and (2) [In]/([In] + [Zn] + [Sn]) | Value of [Zn]/([Zn] + [Sn]) on right-hand side of expression (2) | Left-hand value of expression (3) [Zn]/([In] + [Zn] + [Sn]) | Right-hand value of expression (2) | Relationship of expression (2) | Relationship of expression (1) | Vth | Sputtering rate ratio (SR) | Judgment 1 | Relationship of expression (3) | Presence of residue | Judgment 2 | Oxygen partial pressure ratio (%) | Mobility (cm$^2$/s) |
|---|---|---|---|---|---|---|---|---|---|---|---|---|---|---|---|
| 1 | (a) | 0.117 | 0.437 | 0.386 | 0.112 | x | — | −22.25 | 1.31 | x | ○ | None | ○ | 4 | 12.35 |
| 2 | (a) | 0.123 | 0.607 | 0.532 | 0.349 | ○ | — | −3.5 | 1.14 | ○ | ○ | None | ○ | 4 | 19.72 |
| 3 | (a) | 0.176 | 0.542 | 0.447 | 0.259 | ○ | — | −11 | 1.19 | ○ | ○ | None | ○ | 4 | 16.96 |
| 4 | (a) | 0.231 | 0.440 | 0.338 | 0.116 | x | — | −28.75 | 1.33 | x | ○ | None | ○ | 4 | 13.36 |
| 5A | (a) | 0.209 | 0.592 | 0.468 | 0.329 | ○ | — | −16 | 1.25 | ○ | ○ | None | ○ | 4 | 16.23 |
| 5B | (a) | 0.209 | 0.590 | 0.467 | 0.326 | ○ | — | −8 | 1.12 | ○ | ○ | None | ○ | 10 | 19.67 |
| 6A | (a) | 0.286 | 0.434 | 0.310 | 0.108 | x | — | — | 1.28 | x | ○ | None | ○ | 4 | — |
| 6B | (a) | 0.286 | 0.430 | 0.307 | 0.102 | x | — | −26.25 | 1.25 | x | ○ | None | ○ | 10 | 11.89 |
| 7 | (a) | 0.211 | 0.663 | 0.523 | 0.428 | ○ | — | −10.25 | 1.19 | ○ | ○ | None | ○ | 4 | 19.77 |
| 8A | (a) | 0.290 | 0.540 | 0.384 | 0.256 | x | — | −21 | 1.22 | x | ○ | None | ○ | 4 | 13.34 |
| 8B | (a) | 0.290 | 0.541 | 0.384 | 0.257 | x | — | −19.5 | 1.19 | x | ○ | None | ○ | 10 | 21.18 |
| 9A | (a) | 0.331 | 0.470 | 0.314 | 0.158 | x | — | — | 1.34 | x | ○ | None | ○ | 4 | — |
| 9B | (a) | 0.331 | 0.466 | 0.312 | 0.153 | x | — | — | 1.24 | x | ○ | None | ○ | 10 | — |
| 10 | (b) | 0.242 | 0.704 | 0.534 | — | — | ○ | −5.25 | 1.05 | ○ | ○ | None | ○ | 4 | 29.29 |
| 11 | (b) | 0.293 | 0.620 | 0.438 | — | — | ○ | −17.25 | 1.18 | ○ | ○ | None | ○ | 4 | 21.75 |
| 12 | (b) | 0.240 | 0.768 | 0.584 | — | — | ○ | −3.25 | 1.09 | ○ | ○ | None | ○ | 4 | 21.66 |
| 13A | (b) | 0.365 | 0.764 | 0.485 | — | — | x | — | 1.21 | x | ○ | None | ○ | 4 | — |
| 13B | (b) | 0.365 | 0.764 | 0.485 | — | — | x | −28.5 | 1.12 | x | ○ | None | ○ | 10 | 15.04 |
| 13C | (b) | 0.365 | 0.764 | 0.485 | — | — | x | −23.0 | 0.53 | x | ○ | None | ○ | 50 | 14.75 |

In Table 2, there are provided "remarks columns" for respective Nos., and TFTs fulfilling the expression of [In]/([In]+[Sn])≤0.5 were designated by (a) and TFTs fulfilling the expression of [In]/([In]+[Sn])>0.5 were designated by (b). In examples of (a) above, TFTs fulfilling the expressions (2) and (4) are examples of the present invention. In examples of (b) above, TFTs fulfilling the expressions (1), (3), and (4) are examples of the present invention. In the examples of the present invention, all the examples fulfill the relationship of the expression (4). In the examples of (a) above, TFTs fulfilling the relationship of the expression (2) were designated by the mark "○" on the column "Relationship of expression (2)", and TFTs not fulfilling the relationship of the expression (2) were designated by the mark "x" on the column "Relationship of expression (2)". Similarly, in the examples of (b) above, TFTs fulfilling the relationship of the expression (1) were designated by the mark "○" on the column "Relationship of expression (1)", and TFTs not fulfilling the relationship of the expression (1) were designated by the mark "x" on the column "Relationship of expression (1)"; furthermore, TFTs fulfilling the relationship of the expression (3) were designated by the mark "○" on the column "Relationship of expression (3)", and TFTs not fulfilling the relationship of the expression (3) were designated by the mark "x" on the column "Relationship of expression (3)". The examples of (a) above are not needed to fulfill the relationship of the expression (3), but for reference, the above judgment results were shown on the column "Relationship of expression (3)". In this Example, all the examples of (a) above fulfill the relationship of the expression (3) (evaluated as "○").

The columns "Judgment 1" and "Judgement 2" were provided for the respective characteristics, and TFTs fulfilling the passing criteria of this Example were designated by the mark "○", and TFTs not fulfilling the passion criteria of this Examples were designated by the mark "x". For example, on the column "Judgment 1" right lateral to the column "Sputtering rate ratio (SR)", TFTs having a Vth (absolute value) of not lower than 17.5 V and an SR of not lower than 1.0 were designated by the mark "○", and TFTs not fulfilling either of these requirements were designated by the mark "x". Similarly, on the column "Judgment" right lateral to the column "Presence of residue occurrence", TFTs having no occurrence of residue were designated by the mark "○", and TFTs having occurrence of residue were designated by the mark "x".

From Table 2, it was also found that Nos. 2, 3, 5A, 5B, and 7 [these are the examples of (a) above], and Nos. 10 to 12 [these are the examples of (b) above], fulfilling all the requirements of the present invention, had high sputtering rate ratios, low absolute values of threshold voltage, resulting in excellent TFT characteristics, and no occurrence of residue in the wet etching, because of their fulfilling the requirements of the present invention.

In contrast to this, the following examples were not able to have the desired characteristics because of their not fulfilling any of the requirements of the present invention.

First, with respect to the examples of (a) above, Nos. 1, 4, 6A, 6B, 8A, 8B, 9A, and 9B had high sputtering rate ratios because of their fulfilling the relationship of the expression (3) and had no occurrence of residue in the wet etching, but had high absolute values of threshold voltage because of their not fulfilling the relationship of the expression (2), resulting in deterioration of TFT characteristics.

Then, with respect to the examples of (b) above, Nos. 13A to 13C had high sputtering rate ratios and no occurrence of residue in the wet etching because of their fulfilling the relationship of the expression (3), but had high absolute values of threshold voltage, resulting in deterioration of TFT characteristics, because of their not fulfilling the relationship of the expression (1).

Although not shown in the tables above, TFTs not fulfilling the relationship of the expression (3) had occurrence of residue in the wet etching. In other words, for a TFT fulfilling the composition described below [one example of (b) above], the absence of residue in the wet etching was examined, and it was found that the TFT had occurrence of residue because of its not fulfilling the expression (3).

[In]=0.09, [Zn]=0.85, [Sn]=0.06,

In ratio=0.6, In ratio in all metal elements=0.09, Zn ratio=0.934, and Zn ratio in all metal elements=0.85

The same as above was also found on the examples of a) above, TFTs not fulfilling the relationship of the expression (3) had occurrence of residue in the wet etching (not shown in the tables).

Furthermore, from the results described above, it was also confirmed that sputtering rate decreases with an increase in oxygen partial pressure in the sputtering. In other words, as described above, the respective combinations of TFTs, Nos. 5A and 5B; Nos. 6A and 6B; Nos. 8A and 8B; Nos. 9A and 9B; and Nos. 13A, 13B, and 13C, are examples of TFTs obtained by film formation using approximately the same composition of IZTO and varying the oxygen partial pressure ratio in the sputtering, and there was found a tendency of sputtering rate ratio to become lowered, regardless of the composition of IZTO, with an increase in oxygen partial pressure ratio (in the order of A, B, and C).

Figure 3:
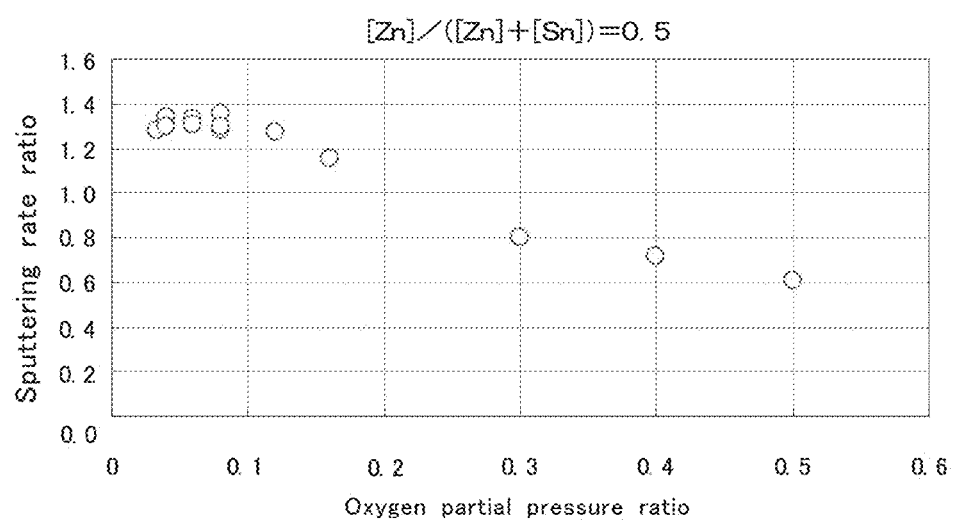
FIG. 3 is a graph showing the relationship between the oxygen partial pressure ratio and the sputtering rate ratio (SR) (when the Zn ratio is 0.5).

FIG. 3 is a graph showing the influence of oxygen partial pressure to sputtering rate in the sputtering. More specifically, FIG. 3 shows the results obtained by examining sputtering rate ratio in the same manner as in the method described above, except that TFTs having the compositions of Nos. 1, 4, and 9 in Tables 1 and 2 were used and oxygen partial pressure was varied in a range of 3% to 50% as shown in Table 3. For reference, the results of sputtering rate are also shown in Table 3. In FIG. 3, oxygen partial pressure is shown by flow rate ratio, not % designation.

TABLE 3

| No. in Table 2 | Oxygen partial pressure ratio (%) | Sputtering rate ratio (SR) |
|---|---|---|
| 4 | 3 | 1.28 |
| 1 | 4 | 1.31 |
| 4 | 4 | 1.33 |
| 9 | 4 | 1.34 |
| 9 | 6 | 1.33 |
| 1 | 6 | 1.31 |
| 1 | 8 | 1.28 |
| 9 | 8 | 1.35 |
| 4 | 8 | 1.3 |
| 4 | 12 | 1.27 |
| 4 | 16 | 1.15 |
| 9 | 30 | 0.8 |
| 9 | 40 | 0.72 |
| 9 | 50 | 0.61 |

As can be seen in FIG. 3, sputtering rate has almost no variation in the region of low oxygen partial pressure where the upper limit of oxygen partial pressure is near approximately 18%, but sputtering rate drastically decreases from somewhere around higher than about 18% oxygen partial pressure. This therefore finds that oxygen partial pressure in the film formation may preferably be lowered to not higher than about 18% to ensure high sputtering rate as desired.

From a series of the results described above, it was able to be confirmed that the use of In—Zn—Sn-based oxide semiconductors having the compositions of Nos. 2, 3, 5, 7, and 10 to 12 in Table 2, which fulfill all the requirements defined in the present invention, provide TFTs with high threshold voltage, excellent etching characteristics in the wet etching, high sputtering rate in the sputtering, high mobility two times higher than that of the conventional IGZO (having a mobility of 7), and satisfactory TFT characteristics. Therefore, the present invention makes it possible to provide oxide semiconductors capable of providing TFTs with satisfactory TFT characteristics, having high production efficiency and excellent patterning properties in the wet etching, and further having satisfactory yield.

Nos. 13A to 13C in Table 2 [the examples of (b) above where the In ratio>0.5] corresponds to a simulated IZTO having a composition as described in Patent Document 2 listed above, for which experiment was carried out with varying oxygen partial pressure. In the IZTO having the above composition, it is found that TFT characteristics cannot be improved when oxygen partial pressure is not increased as shown in FIGS. 5A to 5C. More specifically, switching is not effected at an oxygen partial pressure of 4%, and Vth becomes equal to −28.5 V at an oxygen partial pressure of 10% and −23 V at an oxygen partial pressure of 50%, and it is further found that Vth approaches zero with an increase in oxygen partial pressure to improve TFT characteristics. However, with an increase in oxygen partial pressure, SR becomes small as shown in Table 2, and it is found that in a high In region where the In ratio is high the use of a technique as described in Patent Document 2 above makes it impossible to make compatibility between satisfactory TFT characteristics and high sputtering rate. The above IZTO is one of the examples of (b) above, and examined for the relationship of the expression (1) defined in the present invention. As a result, the above IZTO was found not to fulfill the relationship of the above expression (1) as shown in Table 2, and therefore, it was confirmed that the above expression (1) defined in the present invention is a requirement useful for making compatibility between satisfactory TFT characteristics and high sputtering rate.

Example 2

Figure 6:
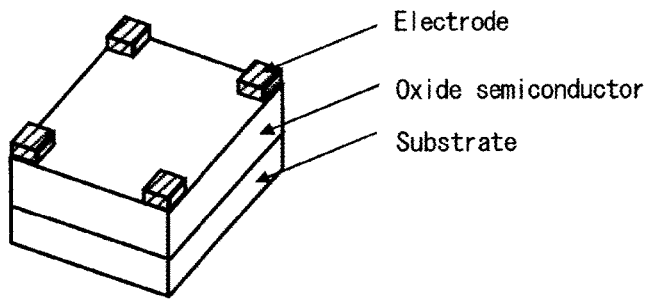
FIG. 6 is a top view of a sample for evaluation, in Example 2, of electronic carrier concentration in an oxide semiconductor layer.

In this Example, various samples were produced with varying sputtering times when oxide films are formed by a sputtering method and further varying per-annealing conditions after the oxide film formation (A1 to A7 in Table 4), and each of the samples was examined for relationship between electronic carrier concentration in each oxide semiconductor layer and TFT characteristics (threshold voltage Vth). At this time, the IZTO thin film of No. 7 in Table 1 above (which thin film fulfills the composition of the present invention) was used to produce an evaluation sample as shown in FIG. 6, followed by measurement of electronic carrier concentration. Furthermore, TFTs as shown in FIG. 1 were produced with the same film thickness and conditions as in the case of the evaluation sample, and then each TFT was measured for threshold voltage Vth in the same manner as described in Example 1.

(1) Production and Evaluation of Samples for Measurement of Electronic Carrier Concentration First, total six samples of the IZTO thin film (40 nm in thickness) having the same composition as No. 6 in Table 1 (A2 to A7) were produced under the same conditions as in the sputtering method described above in Example 1 (the sputtering time was approximately 220 seconds). For comparison, one sample of the IZTO thin film having a thickness of 500 nm (A1) was produced with varied sputtering time (the sputtering time was approximately 2700 seconds).

Then, after the IZTO thin films were produced in such a manner as described above, pre-annealing treatment was carried out in air under steam atmosphere for improvement of film quality. The heat treatment temperatures and times for the respective samples at this time were as follows. For comparison, pre-annealing treatment was not carried out in A3 below.

Pre-annealing Conditions:
No. A1 (film thickness, 500 nm; temperature, 350° C.; and time, 30 minutes)
No. A2 (film thickness, 40 nm; temperature, 350° C.; and time, 30 minutes)
No. A3 (film thickness, 40 nm; and no heat treatment)
No. A4 (film thickness, 40 nm; temperature, 350° C.; and time, 120 minutes)
No. A5 (film thickness, 40 nm; temperature, 400° C.; and time, 30 minutes)
No. A6 (film thickness, 40 nm; temperature, 400° C.; and time, 120 minutes)
No. A7 (film thickness, 40 nm; temperature, 380° C.; and time, 30 minutes)

Then, an electrode film was formed by a sputtering method using pure Au. An apparatus used for the sputtering was "CS-200" available from available from ULVAC, Inc., and the electrode film was patterned by musk sputtering. The formation of a pure Au electrode in such a manner was followed by division to obtain samples for measurement of Hall effects (samples for evaluation of electronic carrier concentrations in the oxide semiconductor layers) as shown in FIG. 6.

Using the respective samples for measurement of Hall effects thus obtained, the measurement of Hall effects (by the van der Pauw method) was carried out at room temperature for evaluation of electronic carrier concentrations.

(2) Production of TFTs

Figure 7:
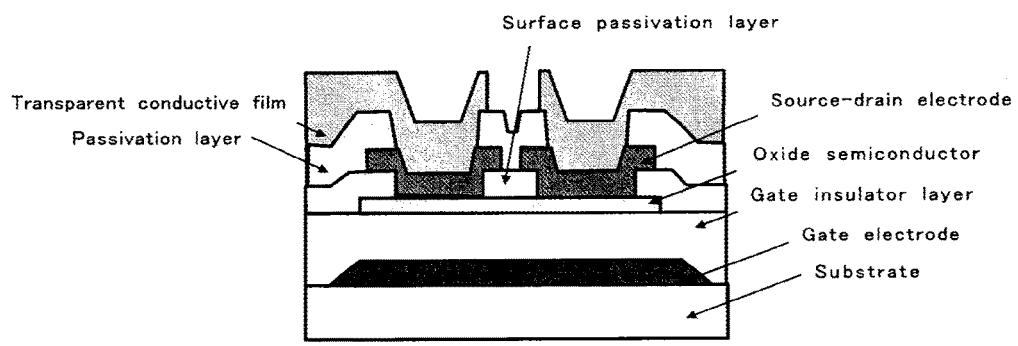
FIG. 7 is a schematic cross-sectional view of a thin-film transistor having an oxide semiconductor, which transistor was used in Example 2.

For examination of relationship between electronic carrier concentration and TFT characteristics, TFTs as shown in FIG. 7 were produced with the same film thicknesses and heat treatment conditions as the samples for measurement of Hall effects in FIG. 6 above, and then evaluated for threshold voltage Vth in the same manner as described in Example 1. TFTs as shown in FIG. 7 and TFTs as shown in FIG. 1, which were used in Example 1, are different only in that a surface passivation layer is formed on the oxide semiconductor layer in FIG. 7 (no surface passivation layer is formed on the oxide semiconductor layer 4 in FIG. 1). Oxide semiconductor layers are easily damaged by, for example, heating treatment in the film formation, and therefore, surface passivation layers are usually formed from $SiO_2$ or other materials.

First, an Mo thin film of 100 nm in thickness and a gate insulator layer of $SiO_2$ (250 nm) were formed successively on a glass substrate (EAGLE 2000 available from Corning Incorporated, having a size of 100 mm in diameter and 0.7 mm in thickness) in the same manner as described above in Example 1.

Then, sputtering and pre-annealing were carried out under the same conditions as for the evaluation samples in (1) above to form IZTO thin films of Nos. A1 to A7 shown in Table 2.

Then, for surface protection of each of the above IZTO thin films (oxide semiconductor layers), a surface passivation layer ($SiO_2$, 100 nm in film thickness) was formed in such a manner as described below. The above $SiO_2$ film was formed by a plasma CVD method using "PD-220NL" available from SAMCO Inc. In this Example, a mixed gas of $N_2O$ and $SiH_4$ was used, and film formation power and temperature were set to 100 W and 200° C., respectively. The surface passivation layer thus formed was patterned by photolithography and dry etching for electrode formation to make contact between the semiconductor layer and the source-drain electrode described below.

Then, a pure Mo source-drain electrode was formed in the same manner as described above in Example 1, after which the channel length and width of each TFT were set to 10 μm and 25 μm, respectively, and a passivation layer [a layered film (364 nm in total film thickness) of $SiO_2$ (114 nm in film thickness) and SiN (250 nm in film thickness)] for protection of the oxide semiconductors layer was formed. After that, a contact hole for probing for evaluation of transistor characteristics and an ITO film were formed in the same manner as described above in Example 1 to produce TFTs as shown in FIG. 7.

The respective TFTs thus obtained were evaluated for threshold voltage Vth in the same manner as described in Example 1.

These results are shown together in Table 4. Table 4 is provided with a judgment column, on which column TFTs fulfilling the range ($10^{15}$ to $10^{18}$ $cm^{-3}$) of electric carrier concentration in the oxide semiconductor layer are designated by the mark "○" and TFTs not fulfilling such a range are designated by the mark "x".

TABLE 4

| No. | Carrier concentration ($cm^{-3}$) | Vth (V) | Judgment |
|---|---|---|---|
| A1 | 4.09E+18 | −30 or lower | x |
| A2 | 2.29E+16 | 2 | ○ |

TABLE 4-continued

| No. | Carrier concentration (cm$^{-3}$) | Vth (V) | Judgment |
|---|---|---|---|
| A3 | 1.0E+13 or lower (unmeasurable) | 30 or higher | x |
| A4 | 5.97E+17 | 2.5 | ○ |
| A5 | 6.76E+17 | 3 | ○ |
| A6 | 6.32E+17 | 3.25 | ○ |
| A7 | 6.22E+17 | 3.25 | ○ |

As can be seen from Table 4, threshold voltage Vth may vary with electric carrier concentration, and all Nos. A2 and A4 to A7, of which electronic carrier concentrations fulfill the requirements of the present inventions (judgment of electronic carrier concentration was "○"), had Vth (absolute values) of not higher than 17.5 V to fulfill the passing criteria of the present inventions. In other words, TFTs, of which electronic carrier concentrations fulfill the requirements of the present invention, had small absolute values of Vth and therefore had excellent TFT characteristics.

In contrast to this, even if fulfilling the composition of the present invention, No. A1 using an oxide thicker (500 nm) in film thickness of the oxide, and No. A3 having a proper film thickness of the oxide but having undergone pre-annealing after the oxide film formation, had electronic carrier concentrations outside the rang of the present invention, had greatly increased absolute values of Vth, and therefore had deteriorated TFT characteristics.

In this Example, experiment was carried out using the oxide having the composition of No. 7 shown in Table 1, and varying process conditions in such a manner as described above. The experiment confirmed that the relationship between the electronic carrier concentration of an oxide semiconductor layer and the TFT characteristics (threshold voltage Vth) was not limited to the oxide having the above composition and the same tendency was found when oxides having compositions as defined in the present invention were used.

EXPLANATION OF REFERENCE NUMERALS

1 Substrate
2 Gate electrode
3 Gate insulator layer
4 Oxide semiconductor layer
5 Source-drain electrode
6 Passivation layer (insulator layer)
7 Contact hole
8 Transparent conductive film

The invention claimed is:

1. A method for preparing a semiconductor layer of a thin-film transistor, the method comprising:
   sputtering an In—Zn—Sn oxide sputtering target consisting of In, Zn, Sn, and O at an oxygen partial pressure of 3% to 18% to form an In—Zn—Sn oxide for the semiconductor layer, and
   heating the In—Zn—Sn oxide at a temperature of 300° C. to 400° C. for 15 to 120 minutes in air under steam atmosphere to obtain the semiconductor layer,
   wherein
   the In—Zn—Sn oxide has a thickness of 30 to 80 nm; and
   the In—Zn—Sn oxide sputtering target satisfies:
   expressions (2) and (4) when $[In]/([In]+[Sn]) \leq 0.5$:

$$[In]/([In]+[Zn]+[Sn]) \leq 1.4 \times \{[Zn]/([Zn]+[Sn]\} - 0.5 \quad (2)$$

$$0.1 \leq [In]/([In]+[Zn]+[Sn]) \quad (4)$$

where [In], [Zn], and [Sn] represent a content by atomic % of In, Zn, and Sn in the In—Zn—Sn oxide sputtering target, respectively.

2. The method of claim 1, wherein the semiconductor layer has an electronic carrier concentration in a range of $10^{15}$ to $10^{18}$ cm$^{-3}$.

* * * * *